United States Patent [19]

Spears, Jr.

[11] Patent Number: 5,384,990
[45] Date of Patent: Jan. 31, 1995

[54] WATER BLASTING PROCESS

[75] Inventor: William E. Spears, Jr., Houston, Tex.

[73] Assignee: Church & Dwight Co., Inc., Princeton, N.J.

[21] Appl. No.: 105,406

[22] Filed: Aug. 12, 1993

[51] Int. Cl.⁶ ............................................. B24B 1/00
[52] U.S. Cl. ..................................... 451/38; 451/40
[58] Field of Search ............... 51/319, 320, 321, 317, 51/293; 134/7

[56] References Cited

U.S. PATENT DOCUMENTS

| | | | |
|---|---|---|---|
| 4,802,312 | 2/1989 | Glaeser et al. | 51/319 |
| 5,081,799 | 1/1992 | Kirschner et al. | 51/321 |
| 5,083,402 | 1/1992 | Kirschner et al. | 51/321 |
| 5,317,841 | 6/1994 | Cook et al. | 51/321 |
| 5,322,532 | 6/1994 | Kurtz | 51/293 |

*Primary Examiner*—Maurina T. Rachuba
*Attorney, Agent, or Firm*—Charles B. Barris

[57] ABSTRACT

An improved wet blasting process is disclosed wherein the liquid carrier medium contains a dispersed particulate abrasive to enhance the blast cleaning efficiency and wherein the particulate abrasive is soluble in the carrier liquid. To minimize dissolution of the soluble particulate abrasive, the liquid carrier comprises a saturated solution such as the dissolved particulate abrasive in the liquid.

21 Claims, No Drawings

WATER BLASTING PROCESS

FIELD OF THE INVENTION

The present invention relates to improvements in wet blasting to remove adherent material such as paint, scale, dirt, grease and the like from solid surfaces.

DESCRIPTION OF THE PRIOR ART

In order to clean a solid surface to preserve metal against deterioration, remove graffiti from stone or simply to degrease or remove dirt from a solid surface, it has become common practice to use an abrasive blasting technique wherein abrasive particles are propelled by a high pressure fluid against the solid surface in order to dislodge previously applied coatings, scale, dirt, grease or other contaminants. Such abrasive blasting has been used favorably, for example, to degrease metal and has replaced the environmentally unsafe solvent treatments.

Various abrasive blasting techniques have been used to clean a surface including dry blasting which involves directing the abrasive particles to the surface by means of pressurized air typically ranging from 30 to 150 psi, wet blasting in which the abrasive blast media is directed to the surface by a highly pressurized stream of water typically 3,000 psi and above, and a process in which both air and water are utilized either in combination at high pressures to propel the abrasive blast media to the surface as disclosed in U.S. Pat. No. 4,817,342, or in combination in which relatively low pressure water is used primarily as a dust control agent or to control substrate damage.

The blast media or abrasive particles most widely used for blasting surfaces either by dry or wet blasting to remove adherent material therefrom is sand. Sand is a hard abrasive which is very useful in removing adherent materials such as paint, scale and other materials from metal surfaces such as steel. While sand is a most useful abrasive for each type of blasting technique, there are disadvantages in using sand as a blast media. For one, sand, i.e., silica, is friable and upon hitting a metal surface will break into minute particles which are small enough to enter the lungs. These minute silica particles pose a substantial health hazard. Additionally, much effort is needed to remove the sand from the surrounding area after completion of blasting. Still another disadvantage is the hardness of sand itself. Thus, sand cannot readily be used as an abrasive to remove coatings from relatively soft metals such as aluminum, stainless steel or non-metallic substrates such as plastic, plastic composite structures, concrete or wood, as such relatively soft substrates can be excessively damaged by the abrasiveness of sand. Moreover, sand cannot be used around moving parts of machinery inasmuch as the sand particles can enter bearing surfaces and the like.

An alternative to sand as a blast media, particularly, for removing adherent coatings from relatively soft substrates such as softer metals as aluminum, stainless steel, composite surfaces, plastics, ceramic tile, concrete and the like is sodium bicarbonate. While sodium bicarbonate is softer than sand, it is sufficiently hard to remove coatings from metal surfaces and as well remove coatings including paint, dirt, and grease from nonmetallic surfaces without harming the substrate surface. Sodium bicarbonate is not harmful to the environment and is most advantageously water soluble such that the particles which remain subsequent to blasting can be simply washed away without yielding environmental harm. Since sodium bicarbonate is water soluble and is benign to the environment, this particular blast media has found increasing use in removing coatings and cleaning dirt, grease and oil and the like from hard surfaces such as steel and interior surfaces such as those which contact food such as in environments of food processing or handling. Sodium bicarbonate is also a friable abrasive and, like sand, will form a considerable amount of dust during the blast cleaning process. To control the dust formed by the sodium bicarbonate blast media as it contacts the targeted surface, water has been included in the compressed air carrier medium either internally of the nozzle or directed as an external stream onto the targeted abrasive particles.

Wet blasting to remove coatings and other contaminants from solid surfaces using a high pressure water stream either alone, or preferably, in conjunction with an abrasive blast media has advantages of economy over utilizing a dry blasting technique in which compressed air is used as the carrier for the blast media from the nozzle structure to the targeted surface. It is relatively easy to pump the water carrier to the high pressures utilized in the wet blasting technique. On the other hand, the compression equipment needed to compress air to even the modest pressures utilized in the dry blasting technique is quite expensive.

The most commonly used wet blasting streams comprise either water alone or water into which has been introduced a quantity of sand, both water and sand being cheap and readily available. As stated above, sand cannot be readily used as an abrasive media when working with relatively soft substrates or in the interior of structures, in particular, where machinery is being utilized. Thus, it would be most worthwhile to use a water soluble abrasive blast media with the high pressure water stream to accelerate the particles through the blast nozzle and treat softer substrates and/or avoid costly clean-up expenses.

For the soluble abrasive material to remain sufficiently abrasive at the work surface, it is necessary to minimize the dissolution of the abrasive particles in the carrier liquid. To minimize the dissolution of the water soluble abrasive particles in a wet blasting process, U.S. Pat. No. 4,125,969 suggests minimizing the amount of intermixing of the soluble abrasive material and the carrier liquid, and also minimize, or avoid entirely, contact of the abrasive material with other surfaces between the blast nozzle means and the work surface. Thus, in accordance with this patent, wet blasting is achieved by supplying the particulate abrasive material in a substantially dry state through a central abrasive outlet in the nozzle means and expelling the carrier liquid at high pressure toward the work surface from a plurality of separate liquid outlets disposed radially outwardly of the central abrasive outlet, and applying the separate streams from the abrasive and nozzle outlets to the work surface. U.S. Pat. No. 4,125,969 also discloses using abrasive particles which are soluble per se in the carrier liquid or particles which are substantially indissoluble per se in the carrier liquid but which break down into sub-particles partially or completely soluble in the carrier liquid. This latter property may be achieved by physical or chemical treatment of the particle surfaces of the soluble abrasive material. Sodium silicate, either alone or in admixture with common salt is suggested as a soluble abrasive. A further suitable soluble crystalline particulate material may, for example, be treated to encourage the decomposition of its surface, followed by baking the particles to a hard glazed outer surface to render them slower to start dissolving. Encapsulation of each particle of soluble abrasive material with a brittle or friable skin of an acceptable insoluble material may also be appropriate. The insoluble material may be one which may be dried or baked over each particle.

Various techniques are known for introducing the particulate abrasive into the water stream, for example, by introduction of a separate air stream which carries the particulate abrasive into the throat of a venturi-type blast nozzle through which the water carrier is passing under high pressure, or by mixing the particulate abrasive/air stream exterior of a blast nozzle means with the high pressure liquid-stream as disclosed in U.S. Pat. No. 4,125,969. For convenience of operation, the particulate abrasive and water have conventionally being allowed to mix while traveling through the interior of the blast nozzle which is used to direct the abrasive/water mixture to the work surface at high velocity.

Introducing the abrasive particles into the water stream and forming a uniform dispersal of the particles in the liquid stream is problematic. Typically, the high pressure water stream and the compressed air stream carrying and accelerating the particles are at substantially differing pressure and velocity rendering uniform mixing most difficult. To provide good working efficiency, the "hot spot" or the area on the targeted surface which is contacted with the abrasive at a given moment should be uniform with respect to the amount of coating removed from the surface. If the particulate material is not uniformly dispersed within the fluid stream, the removal of coatings or other contaminants in the hot spot will not be uniform. The nonuniform hot spot requires the blast nozzle operator to continuously overlap areas of the targeted surface which have already been contacted during the blast cleaning process. Moreover, the use of air compression equipment to direct the abrasive particles into the water stream negates the economic advantages of using a water stream as blast media and carrier for abrasive particles.

Modifying the water soluble abrasive particles such as by applying a coating or some type of water insoluble skin to the particles to reduce dissolution of the particles in the water carrier prior to contact with the substrate surface adds additional expense to the blasting process and also negates the good economy of operation available utilizing the wet blasting technique, in particular, when water is used as the carrier and accelerator stream for an abrasive particle media.

Accordingly, there is a need to improve the efficiency of the wet blasting process, in particular, when wet blasting is used with a particulate abrasive media dispersed within the liquid carrier stream. Still further, there is needed a wet blasting process wherein a mixture of soluble abrasive particles dispersed within a high pressure liquid stream is directed to a target surface and wherein the integrity of the soluble abrasive particle during transport from the supply of abrasive particles to the blast nozzle apparatus and/or from the blast nozzle apparatus to the targeted surface can be maintained so as to retain the maximum cutting force of the particles and at the same time, take advantage of the soluble nature of the abrasive particles with respect to vastly reduced clean-up costs relative to such costs when insoluble abrasive blast media such as sand is used. These unmet needs form the objectives of the present invention and are believed to be met by the novel wet blasting process of the present invention which is described hereinafter.

SUMMARY OF THE INVENTION

The present invention is directed to improvements in wet blasting processes for removing coatings or other contaminants from solid surfaces with a high pressure liquid stream into which liquid stream there is dispersed abrasive particles which are soluble in the liquid carrier. The objects of the invention are achieved by forming the high pressure liquid stream from a slurry comprised of soluble abrasive particles and a saturated liquid. The saturated solution used to form the slurry insures that the particulate abrasive will not readily dissolve prior to contact with the targeted surface and that such particles will substantially retain the original geometry and the inherent abrading efficiency thereof. The slurry of saturated solution and abrasive particles can be formed in the blast nozzle apparatus from separate streams of high pressure saturated liquid carrier and abrasive particles or the slurry can be formed prior to entering the blast nozzle. In the latter instance the abrasive particles can be added to the high pressure carrier stream or the slurry can be formed and then pumped to high pressure for passage through the nozzle. The slurry of saturated solution and abrasive particles can be pumped to a high pressure equivalent to that of water streams and best provides for the uniform dispersal of the abrasive blast particles within the liquid jet.

DETAILED DESCRIPTION OF THE INVENTION

The abrasive particles to be utilized and dispersed within the high pressure liquid stream for wet blasting are preferably water soluble and used with a high pressure liquid stream comprising water. The abrasive typically will be in the form of a powder containing substantially singular particles having an average size range of from about 10 to 1,000 microns in diameter. Preferably, the abrasive particles will have an average size of from about 50–500 microns. Water soluble abrasive particles are advantageous since such blast media can be readily disposed of by a water stream, are readily separated from the insoluble paints and resins which have been stripped to facilitate waste disposal, and since most water soluble blast media are relatively soft, i.e., Mohs hardness less than 3.0, such media can be utilized to remove coatings, grease, dirt and the like from a variety of substrates including hard metals such as structural steel and, importantly, relatively soft metals such as aluminum and stainless steel as well as plastic, ceramic, concrete, wood and composites of such materials. Water soluble blast media having a Mohs hardness of less than 5.0 are generally useful in this invention, in particular, for cleaning softer substrates.

Non-limiting examples of water soluble blast media which can be utilized include the alkali metal and alkaline earth metal salts such as the chlorides, chlorates, carbonates, bicarbonates, sulfates, silicates, the hydrates of the above, etc. The preferred abrasive particles are alkali metal salts and, in particular, sodium and potassium carbonates, bicarbonates and sulfates. The most preferred blast media to be incorporated into the high pressure water stream are the alkali metal bicarbonates as exemplified by sodium bicarbonate. Such a blast media is marketed under the tradename Armex ® by Church & Dwight, Princeton, N.J. Also preferably useful are sodium sesquicarbonate, natural sodium sesquicarbonate known as trona, sodium bicarbonate, sodium carbonate, potassium carbonate, potassium bicarbonate, sodium chloride and sodium sulfate which latter sodium salt is described in commonly assigned U.S. Pat. No. 5,112,406. It is important to note that by water soluble is not meant completely water soluble as some salts and natural minerals such as trona may contain minor amounts of insoluble materials. For example, trona which is a natural sodium sesquicarbonate may contain up to 10 wt. % of insolubles. Thus, by water soluble is meant to include those materials which are substantially soluble in water.

In accordance with the present invention, any of the liquid streams which carry the abrasive particles can comprise a saturated solution. Preferably, the saturated solution is formed from dissolved abrasive media. The saturated solution forming the liquid carrier insures that the abrasive particles which are added to the carrier liquid to enhance the abrasive nature thereof at high pressures do not readily dissolve and retain the geometry and abrasive nature thereof during the blast cleaning process. Thus, all of the liquid streams which contain the abrasive particles should comprise saturated solutions including any liquid stream which carries the abrasive particles from the source of supply to the primary particle accelerator stream as well as the liquid accelerator stream which is mixed prior to the nozzle with the particulate abrasive or directed separately to the nozzle and mixed with abrasive particles at the nozzle prior to being directed to the targeted surface. If the liquid accelerator stream is provided separately to the blast nozzle, the abrasive particles can be added to this high pressure liquid stream by aspiration, by means of compressed air or by admixture in a slurry in which the liquid carrier for the supply of abrasive particles is also a saturated solution so as to minimize dissolution of the abrasive particles from the supply source. Preferably, the abrasive particles are mixed with a saturated solution prior to the nozzle and this slurry is pumped to a high pressure such as by a piston driven positive displacement pump to the nozzle apparatus and subsequently to the targeted surface.

The liquid accelerator stream is preferably water although other liquids can be utilized. For example, glycerin has been utilized as a carrier fluid in blasting operations and is useful since it tends to maintain an even distribution of the particulates therein relative to water in which the particulates tend to settle out. Other water soluble polymeric materials can be used as the carrier liquid or, preferably, as an additive to water to affect the viscosity, specific gravity or surface tension thereof. These water soluble polymers are typically marketed as dust control additives. However, in view of the ease of use, expense with respect to the blast cleaning process and the clean-up of the spent media, water is preferred as the liquid carrier. With water as a carrier, the water soluble abrasive media described above can be used. For example, saturated solutions of sodium bicarbonate and water will comprise from about 7 to about 20% of the sodium bicarbonate depending upon the temperature of the water stream. If sodium carbonate or potassium carbonate are utilized as the blast media, substantially higher levels of these materials must be dissolved in the water stream to obtain a saturated solution. The relative dissolution of the abrasive media described above or other materials in water are readily obtainable from published literature. Once the liquid carrier stream or streams are saturated with the dissolved abrasive media, the abrasive media particles can be added therein to form a slurry with minimal dissolution of the added particles. The abrasive particles can be added by gravity as from a hopper, or carried to the saturated solution either by a compressed air stream or by admixture in a second saturated solution. The slurry can be formed prior to the blast nozzle as described above and pumped to the desired high pressure required for blast cleaning or separate streams of the saturated liquid carrier and abrasive particles can be directed to the blasting apparatus and mixed therein prior to discharge to the targeted surface. The method of mixing the abrasive particles into the liquid carrier is not a critical feature of the invention. What is critical is that the dissolution of the abrasive blast particles be minimized by adding the abrasive blast particles to a saturated solution such as a saturated solution formed of the blast media in the liquid carrier.

The blasting equipment used in the wet blasting process of the present invention can be any of the conventional blasting equipment presently used. Examples include the blasting apparatus disclosed in U.S. Pat. No. 4,817,342 and U.S. Pat. No. 4,125,969. Typically, the wet blasting equipment comprises a venturi nozzle in which the pressurized fluid is accelerated by passage through a restricting orifice and directed to the targeted surface through an expanding outlet section of the nozzle. Usually, the venturi nozzle is a hand held device, although, automatic operation may be useful in some situations. Other high pressure water blasting equipment can be used including "Aqua-Dyne ® high pressure water jet blaster" and "Dyna-Grip" wet abrasive blast system from Aqua-Dyne Incorporated, Houston, Tex. and "Aqua-Miser" blasting equipment for Carolina Equipment and Supply Company, Inc., North Charleston, S.C. which is described in U.S. Pat. No. 5,220,935 herein incorporated by reference. The above mentioned blasting apparatus mix the abrasive particles entrained in a compressed air stream with a separate high pressure liquid stream. The liquid stream and particulate stream are mixed at the nozzle. Typically, wet blasting utilizes liquid pressures of at least about 500 psi and, more typically, greater than about 3,000 psi, even upward to about 20,000 psi.

Alternative equipment and processes can be used to add the abrasive to the liquid stream. For example, as previously stated, a slurry of the abrasive particles and saturated solution can be formed and pumped to a high pressure prior to entering the blast nozzle. The slurry can also be pumped to an intermediate pressure and then directed to the venturi-type nozzle to increase pressure and velocity of the blast medium. Further alternatives include adding a slurry of abrasive and saturated solution to either a compressed air or pressurized water accelerator stream at the blast nozzle. As an example, the "Vapormatt" blast cleaning system from Kleiber and Schulz, Inc. Melville, N.Y., is a system wherein a slurry of insoluble abrasive in water is accelerated in a blast nozzle by compressed air. Such a system can be easily modified to form the slurry of a saturated aqueous solution and a water soluble abrasive as described above.

Often, blast cleaning with water soluble abrasive particles and water used as a dust control agent or as the high pressure carrier for the abrasive particles as in this invention will result in a water soluble residue remaining on the targeted surface. To reduce residues of the blast media from remaining on the substrate surface, the blast media of the present invention can include a surfactant incorporated therein. The surfactant which may be utilized can be anionic, nonionic or amphoteric in nature or mixtures of the various types of surfactant can be used. The surfactant can be added to the abrasive particles or to the water carrier streams. Commonly assigned, copending U.S. applications Ser. No. 006,658 and Ser. No. 006,659, both filed Jan. 21, 1993, describe the types of surfactants which can be added to abrasive blast media particles to reduce residue formation and how such surfactants can be added to the media and are herein incorporated by reference.

The amount of surfactant needed to provide reduced residue content and easily rinsed residues is extremely small in most cases and, thus, will range from about finite levels to about 3 wt. %, preferably about 0.05 to about 1 wt. %, and, more preferably, from about 0.05 to 0.5 wt. % of the abrasive blast media particles. It has further been found that the addition of the surfactant can actually aid in removing any dirt, grease or oil from the substrate. Nonionic surfactants appear to best provide the additional detersive action. Thus, it may be possible to provide several kinds of surfactants with the blast media including those most readily able to reduce residue formation such as anionic surfactants and those capable of enhancing the removal of dirt, grease or oil from the substrate. The surfactant advantageously solubilizes the dirt and grease allowing easier clean up and reduces the deflection of dirt from one surface to another.

Further, agents which provide a post-treatment to the target surface can be added to the liquid stream by direct addition or added to the abrasive particles. For example, sanitizers, rust-proofing agents, fire retardants, etc. which beneficially treat the target surface subsequent to blast cleaning can be used.

A flow aid may be added to the abrasive blast media. Such flow aids reduce caking of the water soluble blast media prior to dispersal in the liquid streams. Most preferably, the flow aid is a hydrophilic or hydrophobic silica, hydrophobic polysiloxane or mixtures of such materials. These flow aids are typically added in amounts of 0.05 to 20%, preferably about 0.1 to 0.5% by weight relative to the total of abrasive particles. One preferred hydrophobic silica which may be utilized in the blasting media hereof is Aerosil R 972, a product which is available from DeGussa AG. This material is a pure coagulated silicon dioxide aerosol, in which about 75% of the silanol groups on the surface thereof are chemically reacted with dimethyldichlorosilane, the resulting product having about 0.7 mmol of chemically combined methyl groups per 100 $m^2$ of surface area and containing about 1% carbon. Its particles vary in diameter from about 10 to 40 nanometers and have a specific surface area of about 110 $m^2$/gram. It may be prepared by flame hydrolysis of a hydrophilic silica as more fully described in Angew. Chem., 72, 744 (1960); F-pS 1,368,765; and DT-AS 1,163,784. Further details respecting such material are contained in the technical bulletin entitled "Basic Characteristics and Applications of AEROSIL" DeGussa AG, August 1986. The hydrophobic silica particles are admixed with the abrasive blasting media in the proportion of at least about 0.1 and up to about 1.0% by weight thereof. Another hydrophobic silica is Quso, marketed by DeGussa A. G.

Hydrophobic polysiloxanes, preferably nonhalogenated polysiloxanes, suitable for use in the blasting media hereof are commercially marketed by Dow Corning and General Electric.

The wet blasting process of the present invention as constituted from the water soluble abrasive particles and saturated liquid solutions as described above are useful for efficient cleaning or decoating of sensitive metals such as aluminum or aluminum alloys, magnesium, or composite substrates, such as utilized on exterior aircraft surfaces, masonry, stucco, plaster, wood or plastics. Stainless steel, and hard steel surfaces can also be cleaned.

EXAMPLE

The following wet blasting system is useful in removing any type of contaminant from a targeted surface. The water blasting equipment utilized is a wet abrasive blast system from Aqua-Dyne Inc. and includes the Aqua-Dyne Model "MS60DS" Jet Blaster which is rated for 10,000 psi at 8 gallons per minute and includes a "Dyna-Grit" accessory to include a solid abrasive into the water stream. The pump is an Aqua-Dyne Model "MS" high pressure pump. First, Armex ® sodium bicarbonate blast media from Church and Dwight having an average diameter of 150 microns is added to a water supply to form a saturated solution containing approximately 10 wt. % bicarbonate. The saturated solution is then pumped to about 10,000 psi and directed to the blast nozzle at about 8 gpm. At the nozzle, another 2 lbs per minute of Armex ® blast media is mixed with the saturated high pressure solution. The slurry leaves the nozzle and is directed by hand operation to the targeted surface for contaminant removal.

What is claimed is:

1. A process for blast cleaning comprising; subjecting a work surface to a composite blast stream of a carrier liquid and a particulate abrasive material which is soluble in said carrier liquid, said carrier liquid comprising a saturated solution so as to minimize dissolution of said particulate abrasive therein.

2. The process of claim 1 wherein said carrier liquid is water and said particulate abrasive is water soluble.

3. The process of claim 2 wherein said water soluble particulate abrasive comprises alkali metal and alkaline earth metal salts.

4. The process of claim 3 wherein said particulate abrasive is selected from the water soluble alkali metal and alkaline earth metal chlorides, chlorates, carbonates, bicarbonates, sulfates, silicates and the hydrates thereof.

5. The process of claim 3 wherein said particulate abrasive comprises alkali metal carbonates, bicarbonates or sulfates.

6. The process of claim 5 wherein said particulate abrasive comprises the alkali metal carbonates or bicarbonates.

7. The process of claim 6 wherein said particulate abrasive comprises sodium bicarbonate.

8. The process of claim 1 wherein said composite blast stream is directed to said work surface by means of a blast nozzle and wherein said composite stream is formed in said blast nozzle.

9. The process of claim 8 wherein said composite stream is formed by mixing said particulate abrasive entrained in a pressurized air stream with said carrier liquid.

10. The process of claim 8 wherein said composite stream is formed by mixing said particulate abrasive contained in a slurry of a saturated solution and said particulate abrasive with said carrier liquid.

11. The process of claim 1 wherein said composite stream is directed to said surface by a pressurized air stream.

12. The process of claim 1 wherein said composite stream is directed to said surface by a pressurized water stream.

13. The process of claim 8 wherein said carrier liquid is water and said particulate abrasive is water soluble.

14. The process of claim 13 wherein said particulate abrasive is sodium bicarbonate.

15. The process of claim 1 wherein said composite blast stream is directed to said work surface by means of a blast nozzle and wherein said composite stream is formed prior to entering said blast nozzle.

16. The process of claim 15 wherein said carrier liquid is water and said particulate abrasive is water soluble.

17. The process of claim 16 wherein said particulate abrasive is sodium bicarbonate.

18. The process of claim 1 wherein said carrier liquid is pressurized to at least 500 psi.

19. The process of claim 1 wherein said carrier liquid is pressurized to at least 3,000 psi.

20. The process of claim 16 wherein said composite stream is pressurized to at least 500 psi.

21. The process of claim 20 wherein said composite stream is pressurized to at least 3,000 psi.

* * * * *